United States Patent [19]

Shiba et al.

[11] Patent Number: 5,524,784

[45] Date of Patent: Jun. 11, 1996

[54] METHOD FOR PRODUCING INK JET HEAD BY MULTIPLE DEVELOPMENT OF PHOTOSENSITIVE RESIN, INK JET HEAD PRODUCED THEREBY, AND INK JET APPARATUS WITH THE INK JET HEAD

[75] Inventors: Shoji Shiba, Sagamihara; Isao Imamura, Yokohama, both of Japan

[73] Assignee: Canon Kabushiki Kaisha, Japan

[21] Appl. No.: 80,494

[22] Filed: Jun. 24, 1993

[30] Foreign Application Priority Data

Jun. 24, 1992 [JP] Japan .................................... 4-166400

[51] Int. Cl.$^6$ ................................ B41C 1/00; G03F 7/00
[52] U.S. Cl. ........................... 216/27; 430/320; 430/324; 430/326; 430/394; 430/328
[58] Field of Search ..................... 216/27, 56; 430/394, 430/324, 325, 326, 320, 328

[56] References Cited

U.S. PATENT DOCUMENTS

| | | | |
|---|---|---|---|
| 4,313,124 | 1/1982 | Hara | 346/140 R |
| 4,345,262 | 8/1982 | Shirato et al. | 346/140 R |
| 4,459,600 | 7/1984 | Sato et al. | 346/140 R |
| 4,463,359 | 7/1984 | Ayata et al. | 346/1.1 |
| 4,558,333 | 12/1985 | Sugitani | 346/140 R |
| 4,608,577 | 8/1986 | Hori | 346/140 R |
| 4,609,427 | 9/1986 | Inamoto et al. | 156/659.1 X |
| 4,657,631 | 4/1987 | Noguchi | 156/655 |
| 4,723,129 | 2/1988 | Endo et al. | 346/1.1 |
| 4,740,796 | 4/1988 | Endo et al. | 346/1.1 |
| 5,030,317 | 7/1991 | Noguchi | 156/630 |

FOREIGN PATENT DOCUMENTS

| | | |
|---|---|---|
| 54-56847 | 5/1979 | Japan . |
| 59-123670 | 7/1984 | Japan . |
| 59-138461 | 8/1984 | Japan . |
| 60-71260 | 4/1985 | Japan . |

Primary Examiner—Thi Dang
Attorney, Agent, or Firm—Fitzpatrick, Cella, Harper & Scinto

[57] ABSTRACT

A method for producing an ink jet head substrate with an ink passage communicated to an ink discharge opening comprises the steps of exposing a positive type photosensitive resin on a substrate according to the pattern of the ink passage and developing part of the resin according to the pattern of the ink passage. The remaining resin matching the pattern of the ink passage is then further exposed and developed and the resulting gap in the pattern is filled with material for forming the ink passage. The rest of the resin is then removed to form the ink passage which, because of the multiple exposing and developing steps, provides an ink jet head with an ink passage of high precision.

12 Claims, 8 Drawing Sheets

METHOD FOR PRODUCING INK JET HEAD BY MULTIPLE DEVELOPMENT OF PHOTOSENSITIVE RESIN, INK JET HEAD PRODUCED THEREBY, AND INK JET APPARATUS WITH THE INK JET HEAD

BACKGROUND OF THE INVENTION

1. Field of the Invention

The present invention relates to a method for producing an ink jet head, an ink jet head produced by the method, and an ink jet apparatus for use of the ink jet head.

2. Related Background Art

A recording apparatus records images (the term "images" herein includes characters) according to image information (the term "image information" herein includes character information or the like) on a recording medium such as paper, a thin plastic film, textiles or any other medium capable of having an image recorded thereon. Such a recording apparatus can function as a printing machine, a copying machine, a facsimile machine and so on, or as an output terminal of a composite electronic machine, such as a work station or the like, functioning as a computer, a word processor and so on. Such a recording apparatus can be characterized by its recording method as an ink jet apparatus, a wire dot apparatus, a thermal printing apparatus, a laser beam apparatus and so on.

In a serial-type recording apparatus using a serial scanning method, in which main scanning is carried out in a main scan direction transverse to a sub-scan direction of conveyance of a recording medium, the recording of images is carried out by a recording means carried on a carriage which moves in the main scan direction along a recording medium after the recording medium is positioned at a predetermined recording region. After recording of one line is finished, a predetermined amount of conveyance of the recording medium in the sub-scan direction is carried out. Then recording of the next line on the stationary recording member is carried out. The main scanning and the sub-scanning are repeated alternately. In this way, recording on the whole recording medium is carried out.

On the other hand, in a full-line type recording apparatus, in which the only movement is the sub-scanning of a recording medium, recording of one line is carried out at almost the same time the recording member is positioned at a predetermined recording region. Then a predetermined amount of conveyance of the recording medium (a pitch of one line) is carried out and recording of the next line is carried out at almost the same time. The one-line recording and the sub-scanning are repeated alternately. In this way, recording of the whole recording medium is carried out. Among the foregoing recording apparatuses, an ink jet recording apparatus carries out recording by discharging ink from a recording head to a recording medium. An ink jet recording apparatus has many advantages. It is relatively easy to produce a compact recording head. Particularly, an ink jet recording head utilizing thermal energy to discharge ink can be made very compact. Images with a high density can be recorded rapidly. Recording on plain paper can be carried out without special treatment of the paper. The running cost is relatively low. Recording can be carried out quietly because it uses a non-impact method. In addition, it is easy to carry out color recording by using plural color inks. An ink jet recording apparatus with a full-line type of recording head which has plural discharge openings extending over the width of a recording area of paper can carry out recording especially rapidly.

In order to carry out ink jet recording of high quality, various methods for producing an ink jet head of high reliability have been proposed. Some of the most effective methods are disclosed in U.S. Pat. No. 4,657,631 and U.S. Pat. No. 5,030,317.

FIGS. 1 to 6 are schematic views showing an example of a method for producing an ink jet head in respect to the aforesaid related background art. In FIGS. 1 to 5, an ink jet recording head with two discharge openings is produced; in FIGS. 6A to 6F more than two discharge openings are formed. However, the example illustrated in FIGS. 1 to 5 corresponds to the example illustrated in FIGS. 6A to 6F.

In this example, as illustrated in FIG. 1, a substrate 1 composed of, for example, glass, ceramic, metal or the like is used as a base member of an ink jet head. FIG. 1 is a schematic perspective view of the substrate on which energy generating bodies for generating energy utilized to discharge ink are provided before formation of ink passages. Numeral 2 designates a energy generating portion of the energy generating body. Electro-thermal converting bodies are used as the energy generating bodies in FIG. 1. However, instead of the electro-thermal converting bodies, for example, piezoelectric elements can be used as the energy generating bodies.

Electrodes (not shown in FIG. 1) for inputting signals are connected to the energy generating portions 2. Functional layers such as a protective layer and the like can be provided with the object of improving the durability of the energy generating bodies.

Next, as illustrated in FIGS. 2A and 2B, a pattern layer 3 is formed according to the pattern of the ink passage on a portion of the substrate 1 on which the energy generating bodies are previously provided. FIG. 2A is a schematic plan view after formation of the pattern layer. FIG. 2B is a schematic cross-sectional view taken along the section line 2B-2B' in FIG. 2A. In this example, for discharging ink from each of two discharge openings corresponding to two energy generating portions of the energy generating bodies, the pattern layer 3 formed on the portion of the substrate 1 comprises parts for two fine ink passages and a part for a common ink chamber for supplying ink to the ink passages.

The material of the pattern layer 3 for this example is a positive type photosensitive material. A positive type photosensitive material has various advantages such as (i) its resolution is better than that of a negative type photosensitive material, (ii) the relief pattern formed thereby has better defined vertical and smooth side wall surfaces, and (iii) the relief pattern formed thereby can be dissolved and removed by using a developing liquid or an organic solvent. Therefore, a positive type photosensitive material is a desirable material for forming the pattern layer 3 as illustrated in FIGS. 2A, 2B and 6A. The positive type photosensitive material may be either a liquid or a dry film. The positive type photosensitive material in the form of a dry film is the most preferable material since a thick film of, for example, 10–100 µm can be produced with the film thickness easily controlled, and its uniformity and handling properties are excellent.

As the positive type photosensitive material, there may be used, for example, materials comprising o-naphthoquinone diazides and alkali soluble phenolic resins, and materials comprising alkali soluble resins and substances capable of finally forming phenol by photolysis such as diazonium salts, for example, benzene diazonium salts. A specific example of a positive type photosensitive dry film that may be used is a film member composed of a polyester sheet and the above-mentioned positive type photosensitive material overlying the polyester sheet such as "OZATEC R 225" (the tradename of such a product manufactured by Hoechst Japan Co.).

The pattern layer 3 can be formed with a positive type photosensitive material 3a, as shown in FIG. 6A, using a so-called image forming process including exposure through a mask 7 to radiation at a wavelength hv, as illustrated in FIG. 6B. In this example, the pattern layer 3 may be produced such that a solvent-soluble polymer layer and a positive type photoresist layer of desired thicknesses are successively laminated on the substrate 1, and the pattern is formed in the positive type photoresist layer followed by selectively removing (developing) the solvent-soluble polymer layer as illustrated in FIG. 6C. As the solvent soluble polymer, there may be used any higher polymer compounds capable of forming a film by coating if there is a solvent which can dissolve the polymer. As the positive type photoresist, there may be used typically a positive type liquid photoresist comprising a novalac type phenolic resin and a naphtho-quinone diazide, and the like. As discussed above, a positive type photosensitive dry film is preferable from the standpoints of processing accuracy, easy removal and processability.

The substrate 1 having thereon the pattern layer 3 is then covered with an ink passage wall forming material as illustrated in FIGS. 3 and 6D. FIG. 3 is a schematic cross-sectional view at a position at or near section lines 2B—2B' in FIG. 2A, after the ink passage forming material 4 has been overlaid. As the ink passage wall forming material, there may be used preferably any material which can cover the abovementioned pattern layer. Since the material is to be a construction material constituting an ink jet recording head by forming ink passages, it is preferable to select a material having excellent mechanical strength, dimensional stability, corrosion resistance and adhesion to the substrate.

As such materials, there are used preferably liquid materials capable of being cured by heat and/or activating energy such as ultra-violet ray and electron beam. In particular, there are preferably used epoxy resins, acrylic resins, diglyco dialkyl carbonate resins, unsaturated polyester resins, polyurethane resins, polyimide resins, melamine resins, phenolic resins, urea resins and the like. In addition, there may be used metals capable of being laminated by electrolytic plating, vapor deposition, sputtering, or the like, for example, Cu, Ag, Au, Ni, Cr, Sn, Pb, Zn, Al, Ti and the like. In this example, it is preferable to use a curable liquid material as the ink passage wall forming material 4 from the standpoint of process efficiency.

When the above-mentioned curable liquid material is used as the ink passage wall forming material 4, the material is coated in a desired thickness on the substrate 1 by means of a known technique such as curtain coating, roll coating, spray coating, spin coating and the like. It is preferable to effect such coating after deaerating the material to avoid entrainment of air bubbles.

When the ink passage wall forming material 4 is in position as illustrated in FIGS. 3 and 6D, and the material is composed of the above-mentioned curable liquid material, curing is carried out under predetermined conditions in such a state that the liquid flow is suppressed; if desired, a pressing plate may be placed at the upper portion of the liquid material.

FIG. 4 is a schematic cross-sectional view showing the liquid material after curing for use as the ink passage wall forming material; the position of the cross section is similar to that of FIGS. 2B and 3. If curing is carried out at room temperature, the material is allowed to stand for 30 min. to 2 hours. If the curing is by application of ultraviolet radiation, irradiation for 10 min. or less at a wavelength hv as illustrated in FIG. 6E can cure the material.

The most useful method for producing a cured ink passage wall forming member 4a is a curing method comprising curing epoxy resins with compounds, such as aromatic diazonium salts, aromatic onium salts and the like, capable of releasing a Lewis acid by application of an activation ray. After curing, the pattern layer is removed.

Though the manner of removing the pattern layer 3 is not restricted, it is preferable, for example, to soak the product illustrated in FIG. 4 in a liquid capable of dissolving and thereby removing the pattern layer 3. When removing the pattern layer 3, if desired, various techniques may be used for accelerating the removal such as ultrasonic treatment, spraying, heating, agitation and the like.

As the liquid used for removing the pattern layer, there can be used, for example, organic solvents (halogen-containing hydrocarbons, ketones, esters, aromatic hydrocarbons, ethers, alcohols, N-methylpyrrolidine, dimethylformamide, phenols and the like), water, aqueous solution of strong alkali (sodium hydroxide, kalium hydroxide and the like) and the like. If necessary, surfactants may be added to the abovementioned liquid. It is preferable to irradiate the pattern layer further with a light such as ultraviolet ray and the like. It is also preferable to heat the liquid to 40°–60° C.

FIGS. 5A and 6F show an example of an ink jet head in which the pattern layer 3 has been removed by dissolution. Ink supplying ports 6 are formed before the pattern layer 3 is removed by dissolution, and the pattern layer is removed. FIG. 5A is a schematic perspective view showing an ink jet recording head preform after the removal of the pattern layer. FIG. 5B is a schematic cross-sectional view at a position similar to that of FIGS. 2B, 3 and 4 after the removal of the pattern layer 3.

In this example, the pattern layer 3 is soaked in a liquid capable of dissolving the pattern layer 3, which is thereby dissolved and removed through ink supplying ports 6. The ink jet head preform shown in FIG. 5A, with fine ink passages 5a communicated with openings 5 and a common ink chamber 5b, is thus obtained.

The product illustrated in FIG. 5A may be cut along a dot and dash line C—C' before removing by dissolution so as to form discharge openings at a precise location. If desired, such cutting may be effected after forming the ink passage. Such cutting is effected mainly so as to get the optimum distance between the energy generating portion 2 of the energy generating body and the discharge opening. However, such cutting is not always necessary. If desired, the surface with the openings can be polished and smoothed for improved ink ejection.

The aforesaid method is effective to produce large quantities of reliable ink jet heads relatively easily. However, as the requirements for recording quality have become more stringent, the dimensional accuracy of the ink jet head, especially the ink passages, must be improved. From this viewpoint, it has turned out that the aforesaid method for producing an ink jet head, which heretofore had been sufficiently accurate, had some deficient aspects.

For example, a positive type photosensitive resin material including naphthoquinonediazo derivative is often used as the material for forming the pattern layer 3. The naphthoquinonediazo derivative has such strong absorbability of light for exposure in a range of a certain wavelength such as i ray, g ray or the like that there occurs lack of exposure of the aforesaid photosensitive resin material, especially a lower part of the resin material near the substrate 1. This is because the light for exposure decays in the aforesaid photosensitive resin material by absorption in the resin material itself. Therefore, it can sometimes be difficult to make a suitably shaped pattern in the aforesaid photosensitive resin material, especially when it is thick. Consequently, it can be difficult to obtain ink jet heads which meet high accuracy requirements for the ink passages (see FIG. 8B).

SUMMARY OF THE INVENTION

The present invention has been developed in consideration of the above situation. It is an object of the present invention to provide an improved method for producing an ink jet head, an improved ink jet head produced by the method and an improved ink jet apparatus for use of the ink jet head each of which can overcome the problems described above.

It is another object of the present invention to provide a method for producing an ink jet head, an ink jet head produced by the method and an ink jet apparatus for use of the ink jet head each of which can readily obtain an ink passage of high accuracy.

It is still another object of the present invention to provide a method for producing an ink jet head, an ink jet head produced by the method and an ink jet apparatus for use of the ink jet head each of which can obtain recording of high quality.

According to one aspect of the present invention, a method for producing an ink jet head with an ink passage communicated to an ink discharge opening comprises the steps of exposing a photosensitive resin on a substrate according to the pattern of the ink passage, developing the resin according to the pattern of the ink passage, thereafter further exposing the resin according to the pattern of the ink passage, thereafter further developing the resin according to the pattern of the ink passage, filling a gap in the pattern with material for forming the wall of the ink passage, and removing the rest of the resin to form the ink passage.

According to another aspect of the present invention, an ink jet head has an ink passage produced by such method.

According to yet another aspect of the present invention, an ink jet apparatus includes an ink jet head with an ink passage produced by such method.

Other objects, features and advantages of the present invention will become apparent from the following detailed description of the preferred embodiments of the present invention and the accompanying drawings.

DESCRIPTION OF THE PREFERRED EMBODIMENTS

FIGS. 7A to 7H are schematic views showing a characteristic process of the present invention for producing an ink jet head. The present invention is described in detail referring particularly to FIGS. 7A to 7H.

Figure 7A:
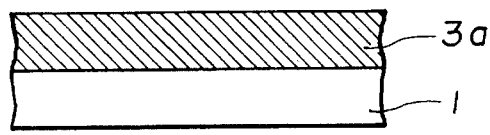
FIGS. 7A to 7H are schematic views showing a characteristic process of the present invention for producing an ink jet head.
Figure 7B:
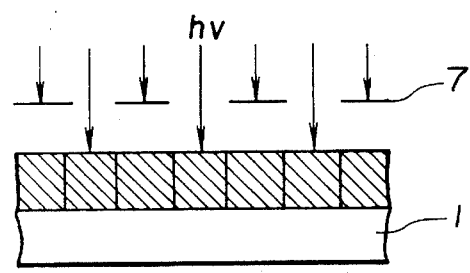
Figure 7C:
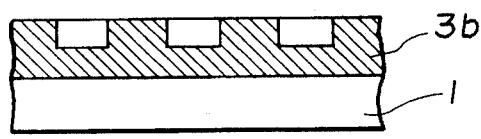

At first, on a substrate 1, which is typically provided with energy generating bodies, a photosensitive layer 3a made of positive type photoresist is formed (FIG. 7A). The portion of the photosensitive layer 3a where a member for forming an ink passage is to be formed is irradiated with energy having a wavelength hv (FIG. 7B). Then, development is effected to form a first pattern layer 3b (FIG. 7C).

Figure 7D:
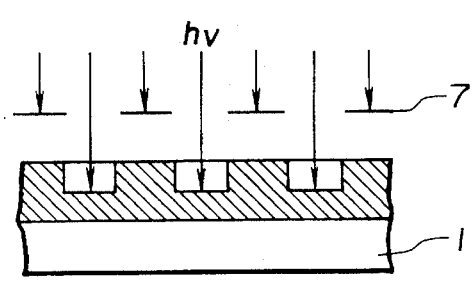
Figure 7E:
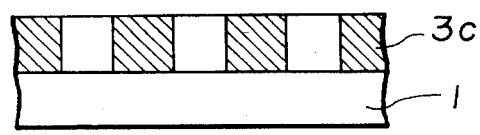

Subsequently, the portion of the photosensitive layer 3a is similarly irradiated again (FIG. 7D). Then, development is effected again to form a second pattern layer 3c (FIG. 7E). In respect of other steps and materials required to complete formation of an ink jet head like that discussed above in connection with FIG. 5A, such steps and materials discussed above can be used.

In the present invention, both exposure and development of the layer 3a are carried out plural times to form the final pattern layer 3c. In other words, both exposure and development are carried out individually in respective depths to form the pattern layer. Therefore, both exposure and development are carried out sufficiently completely that the pattern layer has a well defined and precise configuration. Accordingly, ink passages of high accuracy can be obtained. Consequently, an ink jet head of high reliability is obtained in order to carry out high quality recording.

In the present invention, positive type photosensitive resin is preferably used as the material for forming the pattern used to provide ink passages. Particularly, the effects of the present invention become more conspicuous when positive type photosensitive resin of naphthoquin family is used for forming the pattern because it has a strong absorption property of irradiation. However, the present invention can be used not only with the aforesaid naphthoquin family of resins but also with other positive type photosensitive resins such as chemical amplification types and main chain decomposition types.

In the present invention, a depth or a thickness of removal of material for forming the pattern layer per one exposure and one development is preferably not more than 20 μm. That is, in each exposure and development operation, no more than 20 μm of material is removed. In this specification, the expression "ink passage" is used as a generic word including all ink paths in an ink jet head. For example "ink passage" may include an ink chamber communicated to the ink paths (see, for example, common ink chamber 5b in FIG. 5A).

Figure 8A:
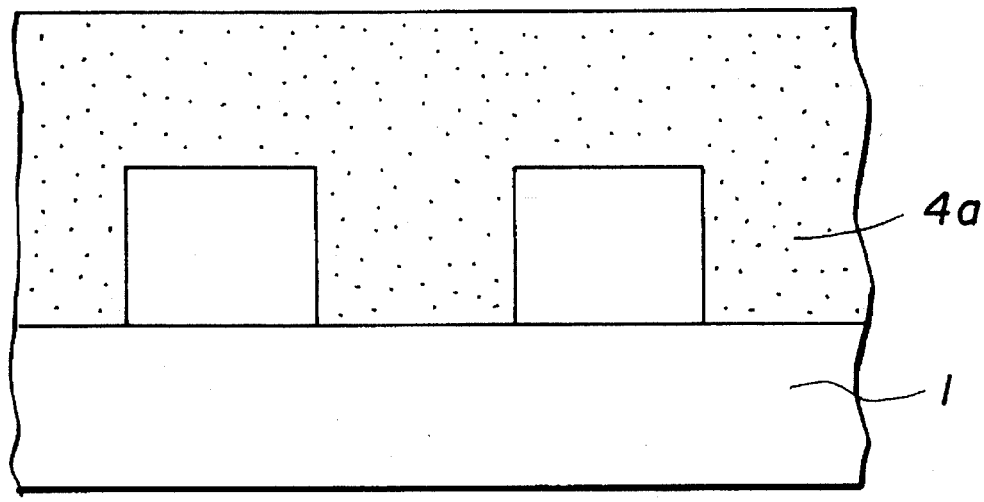
FIGS. 8A and 8B depict the cross sectional configurations of ink passages made using the method of the present invention and using the prior art method, respectively.
Figure 8B:
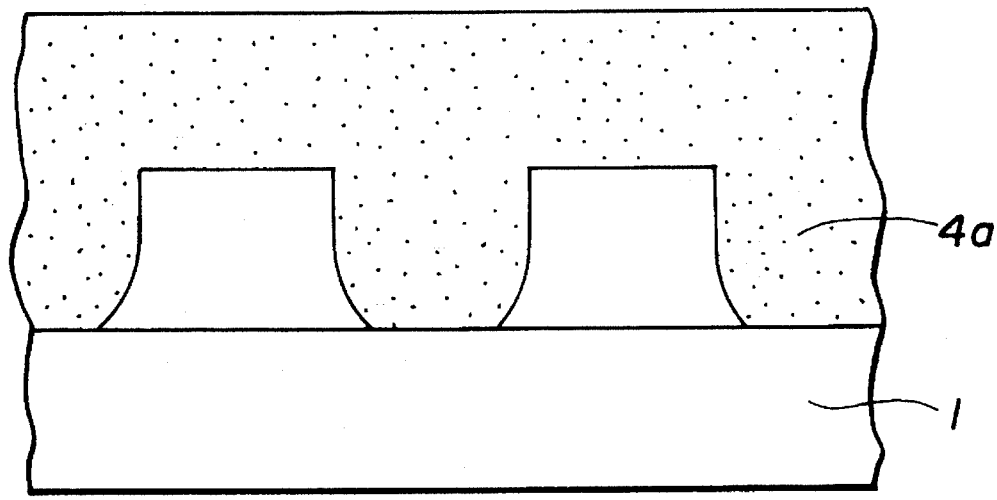
Figure 9:
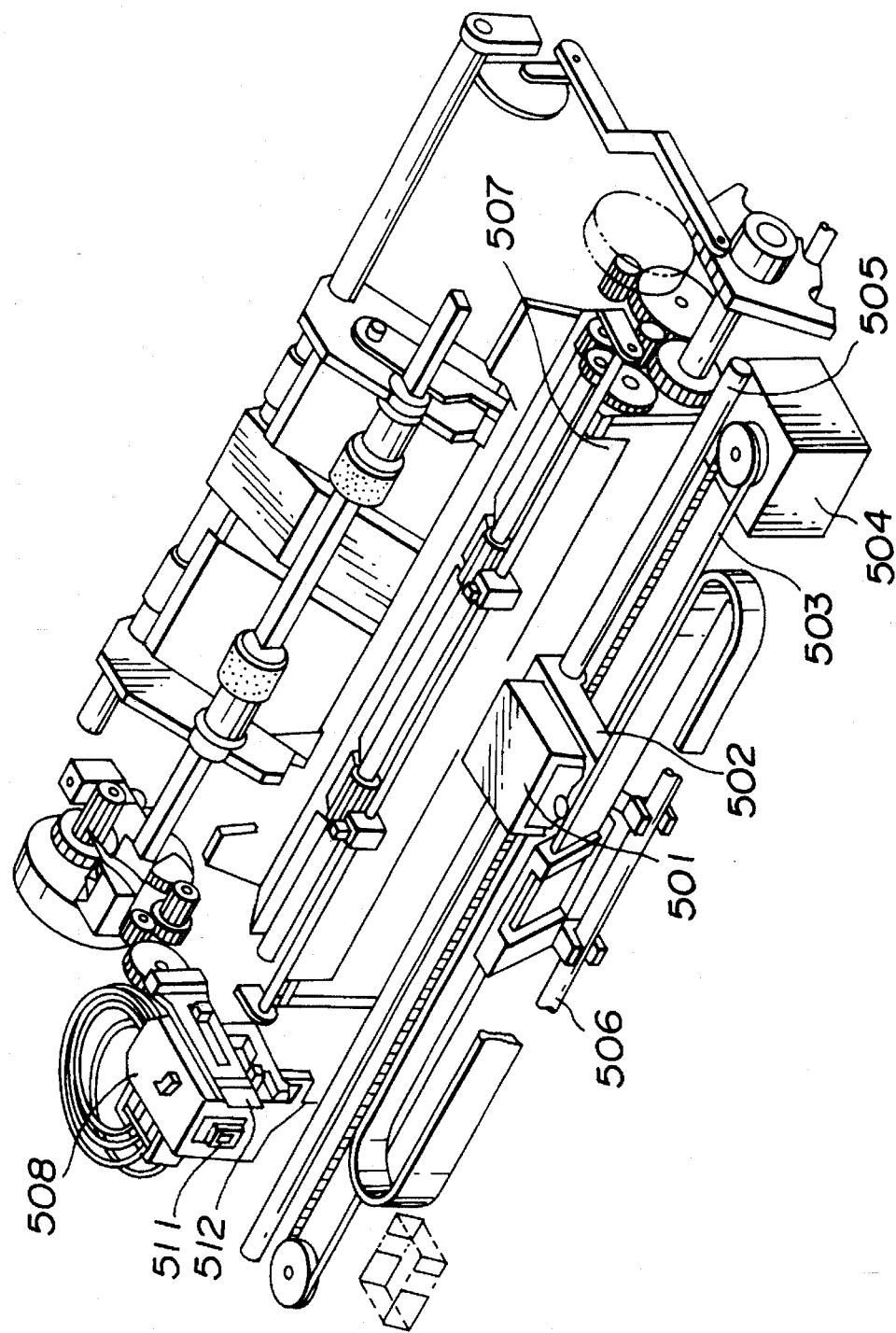
FIG. 9 is a schematic perspective view showing a main portion of an ink jet recording apparatus for use of the ink jet head produced by the present invention.

FIG. 9 is a schematic perspective view showing a main portion of an ink jet recording apparatus for use of the ink jet head produced by the present invention. As illustrated in FIG. 8, an ink jet head 501 is carried on a carriage 502, which is supported along guide shafts 505, 506 for reciprocal movement. A recording medium such as paper, a plastic sheet or a cloth sheet is conveyed in a sub-scanning direction transverse to the main scanning movement of the carriage 502 through a recording area, which is in a range of the movement of the carriage 502. In the recording area, a predetermined gap (a flying distance of a droplet, for example, 0.8 mm) is provided between a front surface (a surface with discharge openings) of the ink jet head 501 and a recording surface of the recording medium. The discharge openings are situated in a line substantially transverse to the main scanning direction of the movement of the carriage 502.

The movement of the carriage 502 is carried out through a driving belt 503 by driving a carriage driving motor 504. Conveyance of the recording medium is carried out on a platen 507 by conveying rollers. The recording of one line onto the recording medium is carried out by discharging ink from selected discharge openings in response to image signals in synchronism with the movement (main scanning) of the ink jet head 501 while the recording medium, which is disposed in the recording area, is stationary. Timings of the discharge of ink are controlled by output from a control circuit. After the recording of one line, the conveyance (sub-scanning) of the recording medium for one line is carried out. Then recording of the next line is carried out as the ink jet head 501 moves (main scanning). The main scanning and the sub-scanning are repeated alternately. In this way, desired images are printed on the recording medium.

A recovery apparatus 508 for maintaining and recovering a discharge capability of the recording head 501 is generally situated at a predetermined position, for example a home position of the carriage 502, which is in the range of the movement of the carriage 502 but out of the recording area. This recovery apparatus has a cap member 511 for covering and closing tightly discharge openings of the recording head from the atmosphere, a cleaning wiper member 512 for wiping off extraneous matter like viscous ink on the surface of the discharge openings of the recording head, and a suction pump (which is not illustrated in FIG. 8) connected to the cap member 511 for carrying out the suction recovery by exerting a suction force on the discharge openings when they are covered by the cap member 511.

Hereinafter, the present invention is described in detail referring to the following examples.

EXAMPLE 1

Figure 1:
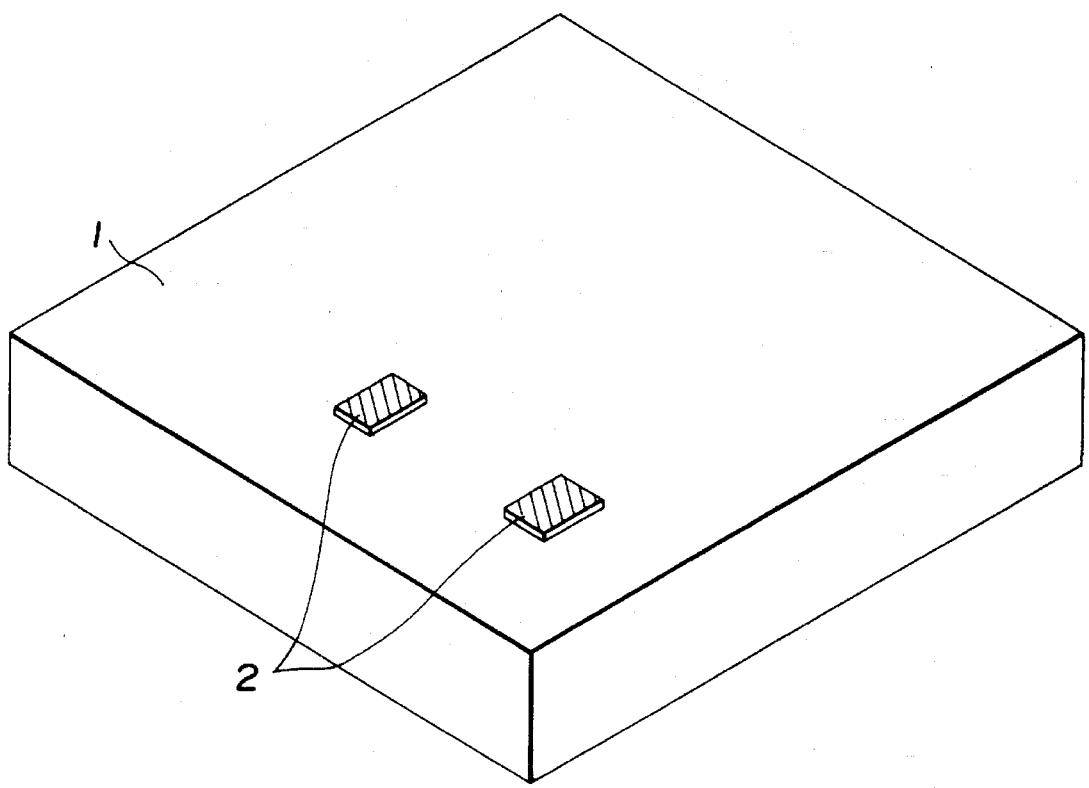
FIGS. 1 to 4, 5A, 5B and 6A to 6F are schematic views showing an example of a method for producing an ink jet head in respect to the related background art.
Figure 2A:
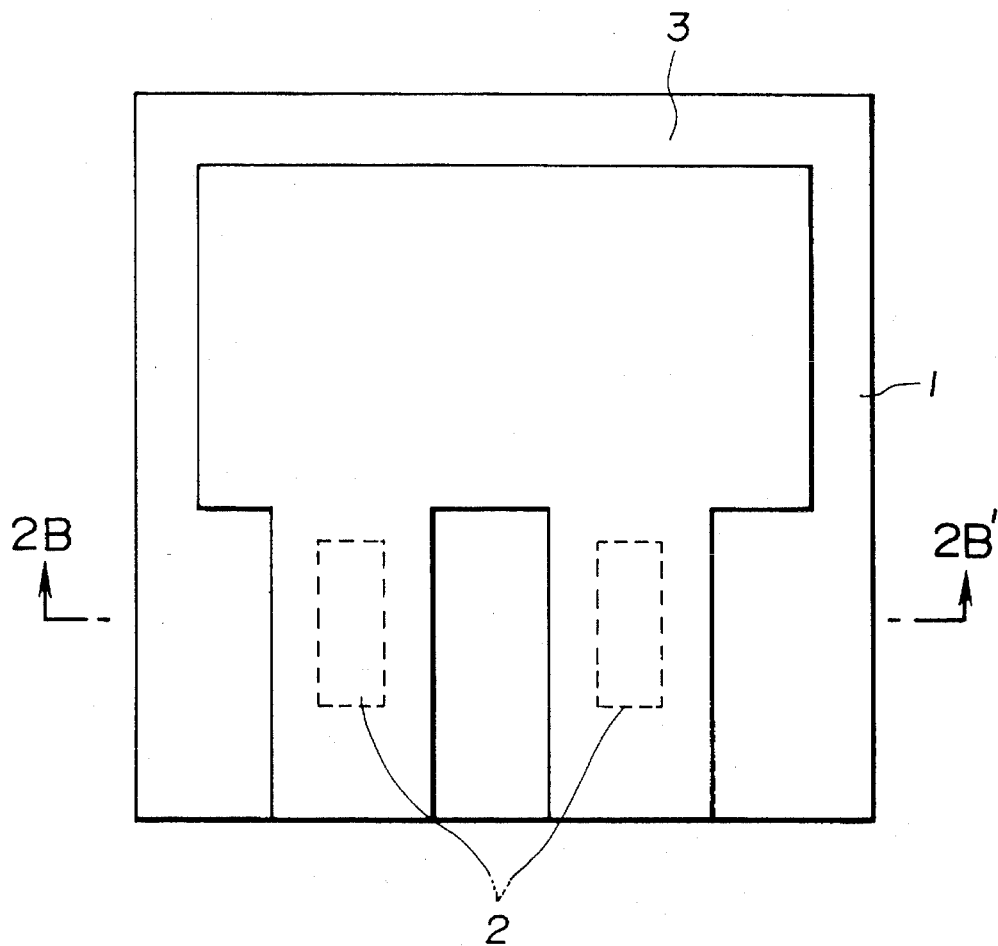
Figure 2B:
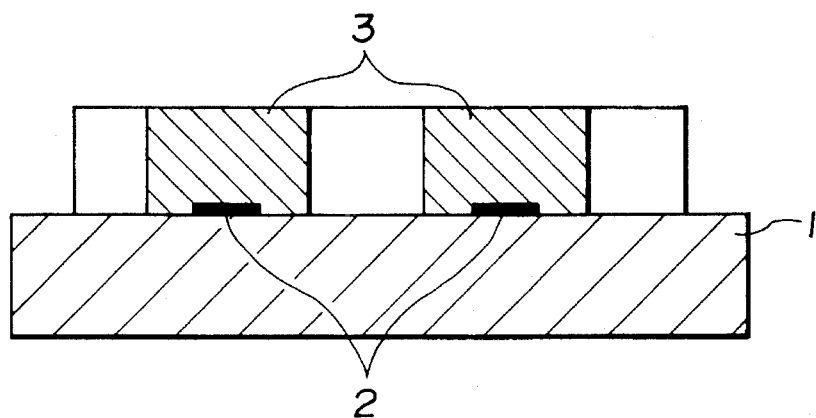
Figure 3:
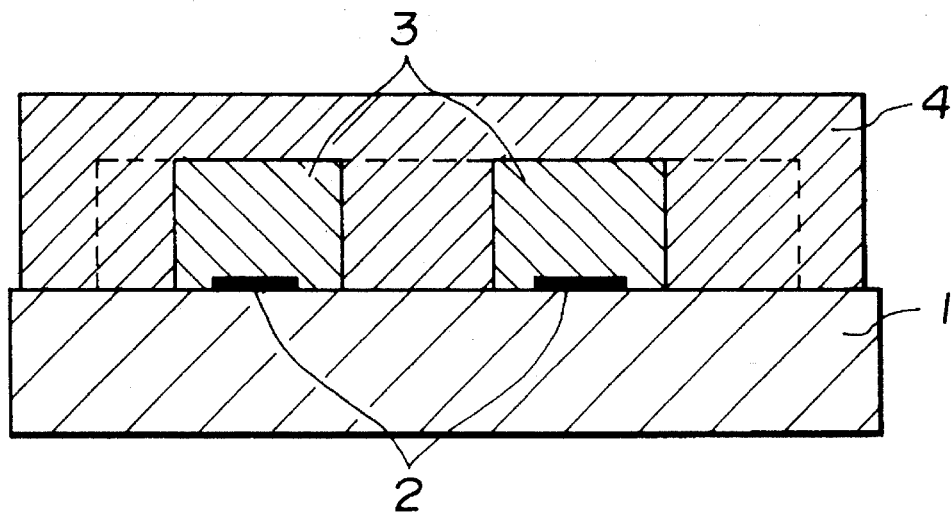
Figure 4:
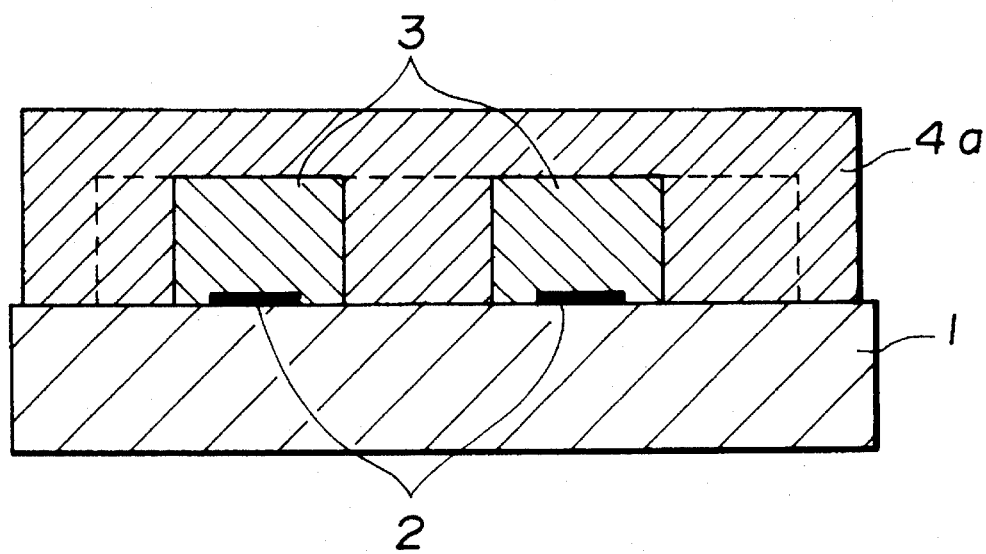
Figure 5A:
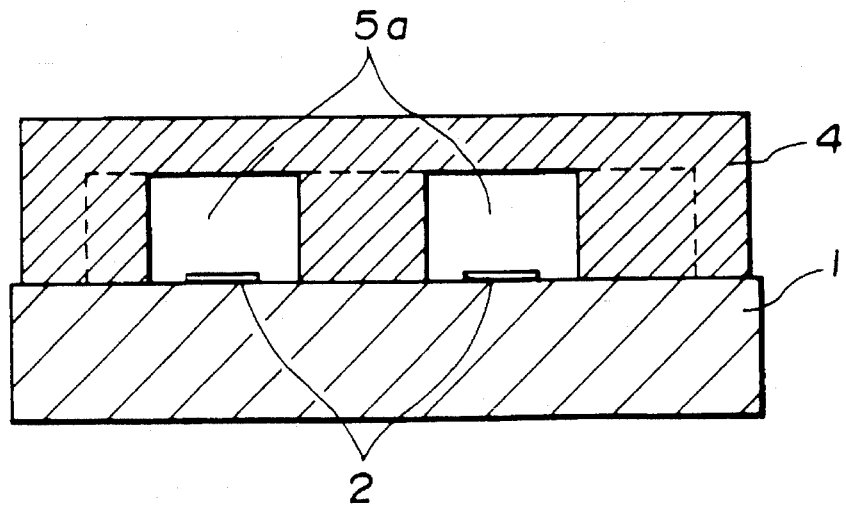
Figure 5B:
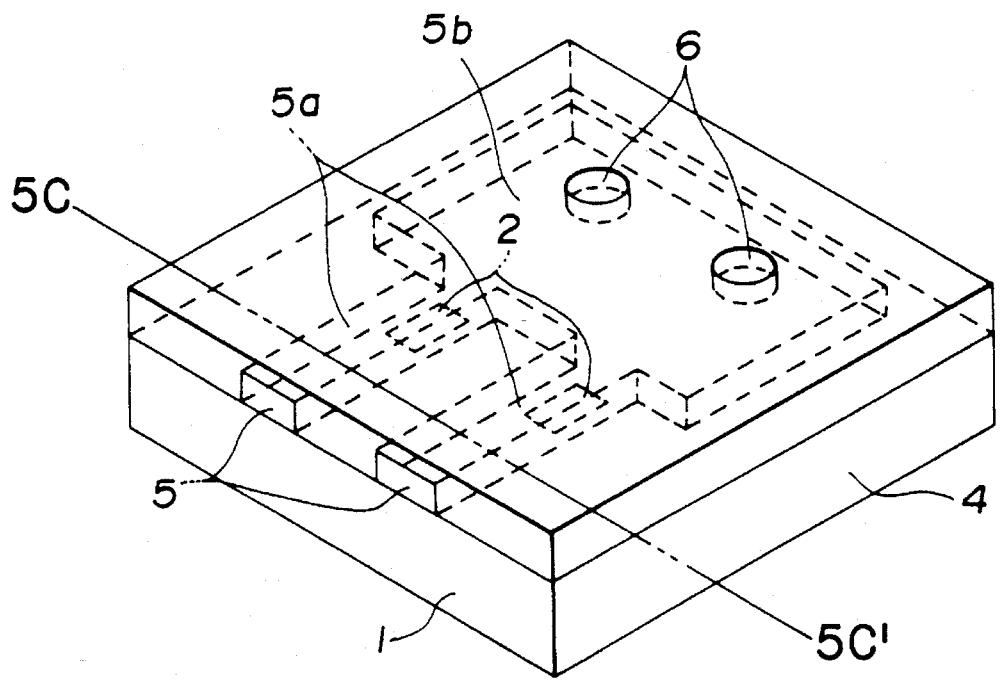

Ink jet recording heads having the basic structure shown in FIG. 5A, but with improved ink passages in accordance with the present invention, were produced as follows.

At first, on a glass substrate 1 provided with electrothermal converting bodies (material: $HfB_2$) as energy generating bodies, a photosensitive layer 3a of 40 μm thick made of positive type photoresist "AZ-4903" (supplied by Hoechst Co.) was formed by spin coating and baking (pre-bake) at 90° C. for 40 minutes in an oven (FIG. 7A). The portion of the photosensitive layer 3a where a member for forming an ink passage was to be formed was irradiated at 800 mJ/c$^2$ through a photomask by using a mask-aligner "PLA-501" (produced by Canon Inc.) (FIG. 7B). Then, development with 0.75 wt. % sodium hydroxide aqueous solution, rinse treatment with ion exchange water and baking (post-bake) at 50° C. for 30 minutes in an vacuum oven were effected to form a first pattern layer 3b, developed portion of which is 20 μm thick (FIG. 7C).

Subsequently, the portion of the photosensitive layer 3b was irradiated again at 800 mJ/c$^2$ through the photomask by using the mask-aligner (FIG. 7D). Then, development with 0.75 wt. % sodium hydroxide aqueous solution, rinse treatment with ion exchange water and baking (post-bake) at 70° C. for 30 minutes in the vacuum oven were effected again to form the finished pattern layer 3c (FIG. 7E). Exposure of the whole second pattern layer 3c by irradiation at 800 mJ/cm$^2$ and deaeration under vacuum condition at 0.1 mmHg for 30 minutes were carried out to ensure that it was completely cured.

It was found by observation with an optical microscope that the second pattern layer 3c was completely developed to the substrate 1 and had sharp rectangular cross sections.

Figure 7F:
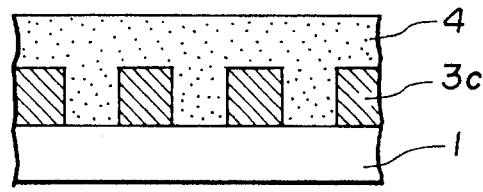

Negative type photosensitive material 4 for forming the wall of the ink passage was supplied on the substrate 1 to cover the second pattern layer 3c and to fill a gap in the second pattern layer 3c (FIG. 7F). The aforesaid negative type photosensitive material was mainly composed of 40 weight parts of Cyracure UVR-6110, 20 weight parts of Cyracure UVR-6200, and 40 weight parts of Cyracure UVR-6351 (these are epoxy resins supplied by Japan Union Carbide Co.). One weight part of triphenyl sulfonium hexafluoro-antimonate was further added.

Figure 7G:
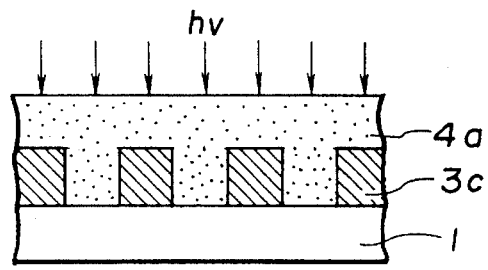
Figure 7H:
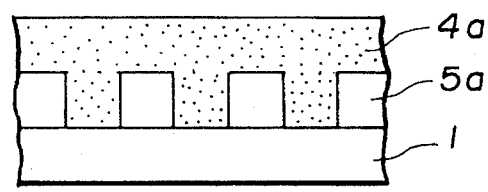

Exposure of the whole negative type photosensitive material 4 by irradiation at 8.5 mJ/c$^2$ was carried out to make a cured member 4a for forming the wall of the ink passage (FIG. 7G). The second pattern layer 3c was dissolved and was removed by soaking in 3.0 wt. % sodium hydroxide aqueous solution (FIG. 7H).

No residue of the second pattern layer 3c was found in the ink passage made in this way. The ink passage made in this way was of high accuracy and reliability, with sharp rectangular cross sections as depicted in FIG. 8A. The ink jet heads with the ink passages made in this way carried out stable recording of high quality in an ink jet apparatus.

EXAMPLE 2

Ink jet recording heads having the basic structure shown in FIG. 5A, but with improved ink passages in accordance with the present invention, were produced as follows.

At first, on a glass substrate 1 provided with electrothermal converting bodies (material: $HfB_2$) as energy generating bodies, a photosensitive layer 3a of 40 μm thick made of positive type photoresist "PMER-PG7900" (supplied by Tokyo Applied Chemistry Co.) was formed by spin coating and baking (pre-bake) at 90° C. for 40 minutes in an oven (FIG. 7A). The portion of the photosensitive layer 3a where a member for forming an ink passage was to be formed was irradiated at 900 mJ/c$^2$ through a photomask by using a mask-aligner "PLA501" (produced by Canon Inc.) (FIG. 7B). Then, development with 1.25 wt. % sodium hydroxide aqueous solution, rinse treatment with ion exchange water and baking (post-bake) at 50° C. for 30 minutes in an vacuum oven were effected to form a first pattern layer 3b, the developed portion of which is 20 μm thick (FIG. 7c).

Subsequently, the portion of the photosensitive layer 3b was irradiated again at 900 mJ/c$^2$ through the photomask by using the mask-aligner (FIG. 7D). Then, development with 1.25 wt.% sodium hydroxide aqueous solution, rinse treatment with ion exchange water and baking (post-bake) at 70° C. for 30 minutes in the vacuum oven were effected again to form a second pattern layer 3c (FIG. 7E). Exposure of the whole second pattern layer 3c by irradiation at 1.0 J/cm$^2$ and deaeration under vacuum condition at 0.1 mmHg for 30 minutes were carried out.

It was found by observation with an optical microscope that the second pattern layer 3c was completely developed to the substrate 1 and had sharp rectangular cross sections.

Negative type photosensitive material 4 for forming the wall of the ink passage was supplied on the substrate 1 to cover the second pattern layer 3c and to fill a gap in the second pattern layer 3c (FIG. 7F). The aforesaid negative type photosensitive material was mainly composed of 40 weight parts of Cyracure UVR-6110, 20 weight parts of Cyracure UVR-6200, and 40 weight parts of Cyracure UVR-6351 (these are epoxy resins supplied by Japan Union Carbide Co.). One weight part of triphenyl sulfonium hexafluoro antimonate was further added.

Exposure of the whole negative type photosensitive material 4 by irradiation at 8.5 mJ/c$^2$ was carried out to make a cured member 4a for forming the wall of the ink passage (FIG. 7G) o The second pattern layer 3c was dissolved and was removed by soaking in 3.0 wt. % sodium hydroxide aqueous solution (FIG. 7H).

No residue of the second pattern layer 3c was found in the ink passage made in this way. The ink passage made in this way was of high accuracy and reliability. The ink jet heads with the ink passages made in this way carried out stable recording of high quality in the ink jet apparatus.

EXAMPLE 3

Ink jet recording heads having the basic structure shown in FIG. 5A, but with improved ink passages in accordance with the present invention, were produced as follows.

The second pattern layer 3c was formed in the same way as in Example 1.

Thermosetting type material 4 composed of "EME-700" (epoxy resin supplied by Sumitomo Bakelite Co.) for forming the wall of the ink passage was supplied on the substrate 1 by transfer molding method to cover the second pattern layer 3c and to fill a gap in the second pattern layer 3c (FIG. 7F).

Baking the material 4 at 150° C. for 10 hours was carried out to make a cured member 4a for forming the wall of the ink passage (FIG. 7G). The second pattern layer 3c was dissolved and was removed by soaking in 3.0 wt. % sodium hydroxide aqueous solution (FIG. 7H).

No residue of the second pattern layer 3c was found in the ink passage made in this way. The ink passage made in this way was of high accuracy and reliability. The ink jet heads with the ink passages made in this way carried out stable recording of high quality in the ink jet apparatus.

EXAMPLE 4

Ink jet recording heads having the basic structure shown in FIG. 5A, but with improved ink passages in accordance with the present invention, were produced as follows.

The second pattern layer 3c was formed in the same way as in Example 2.

Thermosetting type material 4 composed of "EME-700" (epoxy resin supplied by Sumitomo Bakelite Co.) for forming the wall of the ink passage was supplied on the substrate 1 by transfer molding method to cover the second pattern layer 3c and to fill a gap in the second pattern layer 3c (FIG. 7F).

Baking the material 4 at 150° C. for 10 hours was carried out to make a cured member 4a for forming the wall of the ink passage (FIG. 7G). The second pattern layer 3c was dissolved and was removed by soaking in 3.0 wt. % sodium hydroxide aqueous solution (FIG. 7H).

No residue of the second pattern layer 3c was found in the ink passage made in this way. The ink passage made in this way was of high accuracy and reliability. The ink jet heads with the ink passages made in this way carried out stable recording of high quality in the ink jet apparatus.

COMPARATIVE EXAMPLE 1

Ink jet recording heads having the structure shown in FIG. 5A were produced in accordance with the prior art as follows.

In this comparative example 1, the process for producing ink jet heads were carried out in the same way as Example 1 except for the steps mentioned below.

Figure 6A:
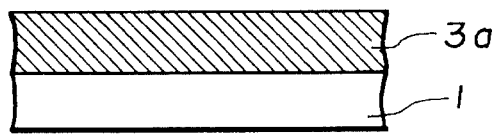
Figure 6B:
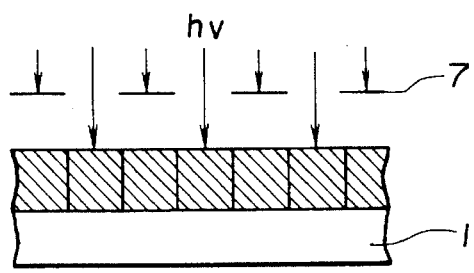
Figure 6C:
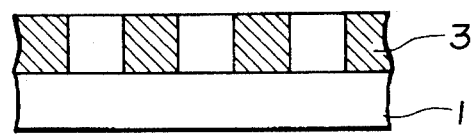
Figure 6D:
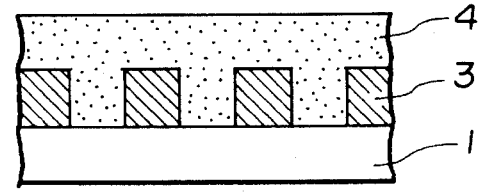
Figure 6E:
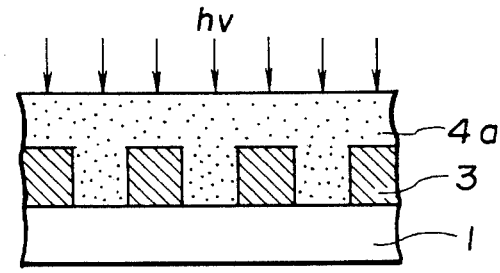
Figure 6F:
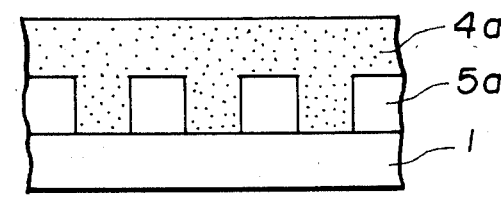

On a glass substrate 1 provided with electro-thermal converting bodies (material: HfB$_2$) as energy generating bodies, a photosensitive layer 3a of 40 μm thick made of positive type photoresist "AZ-4903" (supplied by Hoechst Co.) was formed by spin coating and baking (pre-bake) at 90° C. for 40 minutes in an oven (FIG. 6A). The portion of the photosensitive layer 3a where a member for forming an ink passage was to be formed was irradiated at 2.0 J/cm$^2$ through a photomask by using a mask-aligner "PLA-501" (produced by Canon Inc.) (FIG. 6B). Then, development with 0.75 wt. % sodium hydroxide aqueous solution, rinse treatment with ion exchange water and baking (post-bake) at 70° C. for 30 minutes in an vacuum oven were effected to form a pattern layer 3 (FIG. 6C).

It was found by observation with an optical microscope that the pattern layer 3 was partly left without being developed and partly had trapezoidal cross sections. Consequently, the ink passage made in this way was deficient in accuracy and reliability, as depicted in FIG. 8B. The ink jet heads with the ink passages made in this way carried out recording of deficient quality in the ink jet apparatus.

COMPARATIVE EXAMPLE 2

Ink jet recording heads having the structure shown in FIG. 5A were produced in accordance with the prior art as follows.

In this comparative example 2, the process for producing ink jet heads were carried out in the same way as Example 2 except for the steps mentioned below.

On a glass substrate 1 provided with electro-thermal converting bodies (material: HfB$_2$) as energy generating bodies, a photosensitive layer 3a of 40 μm thick made of positive type photoresist "PMER-PG7900" (supplied by Tokyo Applied Chemistry Co.) was formed by spin coating and baking (pre-bake) at 90° C. for 40 minutes in an oven (FIG. 6A). The portion of the photosensitive layer 3a where a member for forming an ink passage was to be formed was irradiated at 2.0 J/cm$^2$ through a photomask by using a mask-aligner "PLA-501" (produced by Canon Inc.) (FIG. 6B). Then, development with 1.25 wt. % sodium hydroxide aqueous solution, rinse treatment with ion exchange water and baking (post-bake) at 70° C. for 30 minutes in an vacuum oven were effected to form a pattern layer 3 (FIG. 6C).

It was found by observation with an optical microscope that the pattern layer 3 was partly left without being developed and partly had trapezoidal cross sections. Consequently, the ink passage made in this way was deficient in accuracy and reliability. The ink jet heads with the ink passages made in this way carried out recording of deficient quality in the ink jet apparatus.

FIG. 8B illustrates ink passages resulting from using prior art methods like those described in Comparative Examples 1 and 2. FIG. 8B shows enlarged portions of the ink passages where they join the substrate 1. These enlarged portions result from the partial development of the pattern layer used to form the ink passages. These enlarged portions have a size and configuration that is difficult to predict, in that they can vary along the length of an ink passage and from one ink jet head to another. As a result, the discharge accuracy and uniformity of performance characteristics can vary from ink passage to ink passage in a given ink jet head and between different ink jet heads.

In contrast, the ink passages resulting from practicing the present invention, depicted in FIG. 8A, have sharp corners where they join the substrate and have a configuration that is uniform and predictable. That greatly increases the quality of the performance of each ink jet head and the uniformity of performance of different ink passages and different ink jet heads.

The present invention is particularly useful in an ink jet recording head and recording apparatus of the type which discharges an ink by making use of thermal energy. This is because high density of picture elements and high resolution of recording are possible.

The typical structure and the operational principle of such an apparatus are disclosed in U.S. Pat. Nos. 4,723,129 and 4,740,796. The principle is applicable to a so-called on-demand type recording system and a continuous type recording system. Particularly, however, it is suitable for the on-demand type because the principle is such that at least one driving signal is applied to an electrothermal transducer disposed on a liquid (ink) retaining sheet or liquid passage, the driving signal being enough to provide such a quick temperature rise beyond a departure from nucleation boiling point, by which the thermal energy is provided by the electrothermal transducer to produce film boiling on the heating portion of the recording head, whereby a bubble can be formed in the liquid (ink) corresponding to each of the driving signals. By the development and collapse of the bubble, the liquid (ink) is ejected through an ejection outlet to produce at least one droplet. The driving signal is preferably in the form of a pulse, because the development and collapse of the bubble can be effected instantaneously, and therefore, the liquid (ink) is ejected with quick response. The driving signal in the form of the pulse is preferably such as that disclosed in U.S. Pat. Nos. 4,463,359 and 4,345,262. In addition, the temperature increasing rate of the heating surface is preferably such as disclosed in U.S. Pat. No. 4,313,124.

The structure of the recording head may be as shown in U.S. Pat. Nos. 4,558,333 and 4,459,600 wherein the heating portion is disposed at a bent portion in addition to the structure of the combination of the ejection outlet, liquid passage and the electrothermal transducer as disclosed in the above-mentioned patents. In addition, the present invention is applicable to the structure disclosed in Japanese Pat. Laid-Open (Kokai) No. 59-123670 wherein a common slit is used as the ejection outlet for plural electrothermal transducers, and to the structure disclosed in Japanese Pat. Laid-Open (Kokai) No. 59-138461 wherein an opening for absorbing a pressure wave of the thermal energy is formed corresponding to the ejecting portion. This is because the present invention is effective to perform the recording operation with certainty and at high efficiency irrespective of the type of the recording head.

The present invention is effectively applicable to a so-called full-line type recording head having a length corresponding to the maximum recording width. Such a recording head may comprise a single recording head or plural recording heads combined to cover the entire width.

In addition, the present invention is applicable to a serial type recording head wherein the recording head is fixed on the main assembly, to a replaceable chip type recording head which is connected electrically with the main apparatus and can be supplied with the ink by being mounted in the main assembly, or to a cartridge type recording head having an integral ink container.

The provision of the recovery means and the auxiliary means for the preliminary operation are preferable, because they can further stabilize the effect of the present invention. As for such means, there are capping means for the recording head, cleaning means therefor, pressing or suction means, preliminary heating means by the ejection electrothermal transducer or by a combination of the ejection electrothermal transducer and an additional heating element and means for preliminary ejection not for the recording operation, which can stabilize the recording operation.

As regards the kinds of the recording head, it may be a single head corresponding to a single color ink, or may be plural heads corresponding to a plurality of ink materials having different recording colors or densities. The present invention is effectively applicable to an apparatus having at least one of a monochromatic mode for recording mainly with black ink material and a multi-color mode for recording with a mixture of the colors and may be an integrally formed recording unit or a combination of plural recording heads.

Furthermore, in the foregoing embodiments, the ink material has been liquid. It may be, however, an ink material that solidifies at or below room temperature and liquefies at room temperature. Since in the ink jet recording system the ink is controlled within a temperature range not lower than 30° C. and not higher that 70° C. to stabilize the viscosity of the ink to ensure stabilized ejection, in usual recording apparatuses of this type, the ink is such that it is liquid within the temperature range when the recording signal is applied. In addition, a temperature rise due to the thermal energy may be positively prevented by utilizing the thermal energy for the state change of the ink from the solid state to the liquid state, or the ink material solidifying when it is left unused may be used to prevent the evaporation of the ink. In either case, upon the application of the recording signal producing thermal energy, the ink may be liquefied, and the liquefied ink may be ejected. The ink may start to solidify at the time it reaches the recording medium. The present invention is applicable to such an ink material as is liquefied by the application of the thermal energy. Such an ink material may be retained as a liquid or solid material through holes or recesses formed in a porous sheet as disclosed in Japanese Pat. Laid-Open (Kokai) Nos. 54-56847 and 60-71260. The sheet is disposed facing the electrothermal transducers. The most effective system for the ink materials described above is the film boiling system.

The ink jet recording apparatus may be used as an output terminal of an information processing apparatus such as computer or the like, a copying apparatus combined with an image reader or the like, or a facsimile machine having information sending and receiving functions.

The above description of preferred embodiments of the present invention is not intended to foreclose modifications and alterations to such embodiments as would be within the spirit and scope of the invention, which is defined solely by the appended claims.

What is claimed is:

1. A method for producing an ink jet head with an ink passage communicated to an ink discharge opening, said method comprising the steps of:

exposing a photosensitive resin on a substrate according to the pattern of said ink passage;

developing said resin according to said pattern of said ink passage to partially remove the photosensitive resin after exposure;

thereafter further exposing said resin according to said pattern of said ink passage;

thereafter further developing said resin according to said pattern of said ink passage to remove the further exposed photosensitive resin;

filling a gap in said pattern with material for forming a wall of said ink passage; and removing the rest of said resin to form said ink passage.

2. A method for producing an ink jet head according to claim 1, wherein said photosensitive resin is a positive type photosensitive resin.

3. A method for producing an ink jet head according to claim 2, wherein said positive type photosensitive resin is a resin of the naphthoquin family.

4. A method for producing an ink jet head according to claim 2, wherein said positive type photosensitive resin is a chemical amplification type resin.

5. A method for producing an ink jet head according to claim 2, wherein said positive type photosensitive resin is a main chain decomposition type resin.

6. A method for producing an ink jet head according to claim 1 or 2, wherein not more than 20 μm in thickness of said resin is removed in each said exposing step and said developing step.

7. A method for producing an ink jet head according to claim 1 or 2, wherein said developing steps are carried out by using solvent.

8. A method for producing an ink jet head according to claim 1 or 2, wherein said filling step is carried out by a transfer molding method.

9. A method for producing an ink jet head according to claim 1 or 2, wherein said removing step is carried out by using solvent.

10. A method for producing an ink jet head according to claim 1, wherein curing of said material for forming said wall of said ink passage is carried out between said filling step and said removing step.

11. A method for producing an ink jet head according to claim 10, wherein said curing is carried out by irradiation.

12. A method for producing an ink jet head according to claim 1 or 2, wherein cutting to form said discharge opening is carried out between said filling step and said removing step.

* * * * *

UNITED STATES PATENT AND TRADEMARK OFFICE
CERTIFICATE OF CORRECTION

PATENT NO. : 5,524,784  Page 1 of 2
DATED : June 11, 1996
INVENTOR(S) : SHOJI SHIBA, ET AL.

It is certified that error appears in the above-indentified patent and that said Letters Patent is hereby corrected as shown below:

COLUMN 1

Line 54, "Among" should read --¶ Among--.

COLUMN 2

Line 21, "a" should read --an--.

COLUMN 4

Line 4, "If" should read --¶ If--; and
Line 48, "line C-C'" should read --line 5C-5C'--.

COLUMN 6

Line 51, "In" should read --¶ In--.

COLUMN 7

Line 59, "an" should read --a--.

COLUMN 8

Line 51, "an" should read --a--.

COLUMN 9

Line 15, "o" should read --.--.

UNITED STATES PATENT AND TRADEMARK OFFICE
CERTIFICATE OF CORRECTION

PATENT NO. : 5,524,784
DATED : June 11, 1996
INVENTOR(S) : SHOJI SHIBA, ET AL.

It is certified that error appears in the above-indentified patent and that said Letters Patent is hereby corrected as shown below:

COLUMN 10

Line 27, "an" should read --a--; and
Line 57, "an" should read --a--.

Signed and Sealed this

Fifth Day of November, 1996

Attest:

BRUCE LEHMAN

Attesting Officer

Commissioner of Patents and Trademarks